(12) United States Patent
Takasaki

(10) Patent No.: US 7,741,215 B2
(45) Date of Patent: Jun. 22, 2010

(54) SEMICONDUCTOR DEVICE AND METHOD FOR MANUFACTURING THE SAME

(75) Inventor: Chiharu Takasaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 277 days.

(21) Appl. No.: 11/809,478

(22) Filed: Jun. 1, 2007

(65) Prior Publication Data

US 2007/0281470 A1 Dec. 6, 2007

(30) Foreign Application Priority Data

Jun. 2, 2006 (JP) ............................ 2006-155409

(51) Int. Cl.
*H01L 21/4763* (2006.01)
(52) U.S. Cl. ................. 438/637; 438/254; 438/397; 438/672; 257/E21.578
(58) Field of Classification Search ......... 438/254–255, 438/397, 637–640, 672, 675; 257/E21.008, 257/E21.577, E21.578
See application file for complete search history.

(56) References Cited

U.S. PATENT DOCUMENTS

2005/0136644 A1* 6/2005 Inukai et al. ................ 438/623
2005/0287738 A1* 12/2005 Cho et al. ................... 438/253

FOREIGN PATENT DOCUMENTS

| JP | 60-250650 | 12/1985 |
| JP | 09-045633 | 2/1997 |
| JP | 10-050835 | 2/1998 |
| JP | 2001-035921 | 2/2001 |

* cited by examiner

*Primary Examiner*—Thanhha Pham
(74) *Attorney, Agent, or Firm*—Scully, Scott, Murphy & Presser, P.C.

(57) ABSTRACT

The present invention provides a method for manufacturing a semiconductor device, including the step of forming a hole penetrating an insulating film over a semiconductor substrate, wherein the step includes the steps of forming a pedestal at a position where a hole to be formed; forming an insulating film to bury the pedestal; forming a first hole in the insulating film so as to expose a top surface of the pedestal; and removing the pedestal to form a second hole continuous with the first hole to form a hole penetrating the insulating film.

7 Claims, 10 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing a semiconductor device, and in particular, to the structure of plugs used to connect an upper conductor to a lower conductor and a method for forming plugs, as well as a method for forming a capacitor having a trench structure.

2. Description of the Related Art

In recent years, semiconductor devices have been more and more highly integrated, requiring more precise micromachining. The semiconductor devices require a plug to be formed in an interlayer insulating film in order to connect an upper interconnection layer and a lower interconnection layer together. The plug is normally formed by forming a hole in the interlayer insulating film by dry etching and filling the hole with a conductive material. However, a decrease in the planar area in which the hole can be formed has made the machining based on dry etching significantly difficult.

This difficulty will be described in further detail taking a DRAM (Dynamic Random Access Memory) shown in FIG. 1 as an example.

An n well 102 is formed in a p-type silicon substrate 101. A first p well 103 is formed inside the n well 102. A second p well 104 is formed in the area except for the n well 102. An element isolation region 105 is formed around the p well on a front surface side of the silicon substrate. For convenience, the first p well 103 shows a memory cell region in which a plurality of memory cells are located. The second p well 104 shows a peripheral circuit region.

Switching transistors 106 and 107 are provided in the first p well 103 and each has a gate serving as a word line that is a component of each memory cell. The transistor 106 is composed of a drain 108, a source 109, and a gate electrode 111 provided on the silicon substrate via a gate insulating film 110. The transistor 107 is composed of a source 109 shared by the transistor 106, a drain 112 and a gate electrode 111 provided on the silicon substrate via the gate insulating film 110. An interlayer insulating film 113 with a flat surface covers the transistors.

A contact hole 114 is formed in a predetermined region of the interlayer insulating film 113 and connected to the source 109. A bit interconnection contact plug 115 is provided inside the contact hole 114 and consists of polycrystalline silicon 115a and metal silicide 115b. A bit interconnection 116 is connected to the bit interconnection contact plug 115 and consists of tungsten nitride 116a and tungsten 116b. An interlayer insulating film 118 with a flat surface covers the bit interconnection 116.

Contact plugs 117 are provided in a predetermined region of the interlayer insulating film 113 and connected to the drains 108 and 112 of the transistors. Capacitance contact holes 119 are formed in a predetermined region of the interlayer insulating film 118 so as to be connected to the contact plugs 117; capacitor contact plugs 120 are provided inside the contact holes 119. A silicon nitride film 121 and an interlayer insulating film 122 are provided over the capacitor contact plug 120 and interlayer insulating film 118.

Capacitors having cylinder structures are provided in a predetermined region of the interlayer insulating film 122. Each capacitor is composed of a lower electrode 124 and a dielectric 125 provided on an inner surface of a cylinder hole 123 formed in the interlayer insulating film 122, and an upper electrode 126 formed to fill the hole. The lower electrode 124 is connected to the capacitor contact plug 120. An interlayer insulating film 127 covers the upper electrode 126. The upper electrode 126 has its partial area led out to a peripheral circuit as a lead-out region 135. The lead-out region 135 is connected to a metal interconnection 134 via a via plug 137 provided in a through-hole 136 formed in the interlayer insulating film 127.

On the other hand, a transistor constituting a peripheral circuit is provided in the second p well 104. The transistor is composed of the source 109, drain 112, gate insulating film 110, and gate electrode 111. Contact holes 128 are formed in predetermined regions of the interlayer insulating film 113 so as to connect to the source 109 and the drain 112. Titanium silicide layers 129 are formed on a source and a drain located at the bottoms of the respective contact holes. Contact plugs 130 are provided inside the respective holes in contact with the respective titanium silicide layers; each of the contact plugs 130 consists of titanium nitride and tungsten. An interconnection layer 131 is provided on each of the contact plugs 130 and consists of tungsten nitride 131a and tungsten 131b. The interconnection layer 131 partly connects to the interconnection 134 via a via plug 133 that fills a through-hole 132 formed through the interlayer insulating film 118, silicon nitride film 121, and interlayer insulating films 122 and 127; the via plug 133 consists of titanium nitride and tungsten.

As is apparent from the above example of a DRAM, many holes are formed in the interlayer insulating films in order to form plugs for the connection between the upper and lower interconnection layers as well as cylinders for capacitors. In particular, for the capacitance contact hole 119 and capacitor cylinder hole 123 formed in the memory cell region, and the through hole 132 formed in the peripheral circuit region, a demand for an increase in integration level has increased aspect ratio, expressed as the ratio of the depth to diameter of the hole, to 15 to 20. This makes it very difficult to machine these holes.

Japanese Patent Laid-Open Nos. 9-45633, 10-50835, and 2001-35921 disclose methods for forming a contact hole and a contact plug.

The above holes are normally formed in interlayer insulating films of silicon oxide. Anisotropic dry etching by high-frequency plasma is used to form holes. To dry etch silicon oxide, it is necessary to break the bond between silicon and oxygen, to cause silicon to react to generate a volatile substance, and to exhaust the substance. Fluorine can be effectively used for reaction with silicon. A source gas may be octaflorocyclobutane (C4F8), octaflorocyclopentane (C5F8), or the like. The source gas is decomposed and excited in plasma to generate fluorine ions. The generated fluorine ions are accelerated by an electric field applied to between the plasma and a stage for the semiconductor substrate. The fluorine ions thus impact the surface of the silicon oxide. The resulting acceleration energy is used to break the bond between silicon and oxygen. The silicon is caused to react to generate volatile silicon fluoride, which is then exhausted. A basic reaction process has been described, and many variations and modifications are actually made to the process. For example, argon gas may be added in order to improve the effect of ions.

If any one of the above holes is to be formed, an etching reaction occurs at the bottom surface of the hole. Accordingly, retention of constant etching characteristics is expected to require the maintenance of the balance between the supply, to the bottom surface, of reaction particles (fluorine ions) contributing to the etching and the exhaust, from the bottom surface, of a reaction product (silicon fluoride) resulting from the etching. However, when the hole becomes deeper to increase the aspect ratio, the reaction product is insufficiently exhausted and is likely to remain at the bottom of the hole. As a result, the remaining reaction product hampers the passage of ions contributing to the etching, causing the etching rate to start decreasing. Finally, the etching is disabled.

Further, the remaining reaction product causes the source gas and reaction product to be polymerized in the hole, with the resulting polymeric substance adhering to the inner wall of the hole. The adhesion of the polymer reduces the hole diameter during etching in a self aligning manner. The hole is thus tapered toward the deeper side and thus shaped like a mortar. This prevents the desired capacitor shape from being obtained, making it difficult to ensure storage capacitance. Further, unfortunately, the contact area of the plug in the hole with the lower conductor decreases to increase contact resistance. The inventors have empirically clarified that this problem becomes actual at an aspect ratio of greater than 10. For example, when a depth of a hole with diameter 0.2 μm increases above 2 μm (aspect ratio: 10), the problem becomes actual. When the depth of the hole becomes 3 μm, the problem becomes significant.

SUMMARY OF THE INVENTION

An object of the present invention is to provide a method for manufacturing a semiconductor device which method includes a hole forming step that can reduce tapering of a hole toward the bottom to provide an appropriate opening area at the hole bottom even if the hole is deep and has a high aspect ratio, as well as a semiconductor device having a plug structure appropriately connected to a lower conductor.

A first aspect in accordance with the present invention provides a method for manufacturing a semiconductor device, comprising the step of forming a hole penetrating an insulating film over a semiconductor substrate, wherein the step comprises the steps of:

forming a pedestal at a position where a hole to be formed;

forming an insulating film to bury the pedestal;

forming a first hole in the insulating film so as to expose a top surface of the pedestal; and removing the pedestal to form a second hole continuous with the first hole to form a hole penetrating the insulating film.

A second aspect in accordance with the present invention provides a method for manufacturing a semiconductor device, comprising the step of forming a conductive plug penetrating an insulating film over a semiconductor substrate and connecting to a conductor under the insulating film, wherein the step comprises the steps of:

forming a pedestal on a conductor;

forming an insulating film to bury the pedestal;

forming a first hole in the insulating film so as to expose a top surface of the pedestal;

removing the pedestal to form a second hole continuous with the first hole so as to expose a surface of the conductor; and filling the first hole and the second hole with a conductive material to form a conductive plug penetrating the insulating film and connecting to the conductor.

A third aspect in accordance with the present invention provides a method for manufacturing a semiconductor device, comprising the steps of:

forming a conductive plug in a first interlayer insulating film formed over a semiconductor substrate;

forming a pedestal on the conductive plug;

forming a second interlayer insulating film to bury the pedestal;

forming a first hole in the second interlayer insulating film so as to expose a top surface of the pedestal;

removing the pedestal to form a second hole continuous with the first hole so as to expose a surface of the conductive plug;

forming a first conductive layer on an inner surface of the first hole and the second hole to form a lower electrode comprising the first conductive layer and connecting to the conductive plug;

forming a dielectric layer on the first conductive layer in the first hole and the second hole; and forming a second conductive layer on the dielectric layer in the first hole and the second hole to form a capacitor comprising an upper electrode, the dielectric layer, and the lower electrode, the upper electrode comprising the second conductive layer.

A fourth aspect in accordance with the present invention provides a method for manufacturing a semiconductor device, comprising the step of forming a hole penetrating an interlayer insulating film over a semiconductor substrate, wherein the step comprises the steps of:

forming a first non-silicon-containing film composed of one of an organic material and a carbon-containing material that contain no silicon over the semiconductor substrate;

forming a first silicon oxide film on the first non-silicon-containing film;

forming a first resist pattern on the first silicon oxide film;

etching the first silicon oxide film using the first resist pattern as a mask;

etching the first non-silicon-containing film using the etched first silicon oxide film as a mask to form a pedestal at a position where a hole is to be formed;

forming an interlayer insulating film composed of silicon oxide so as to bury the pedestal;

forming, on the interlayer insulating film, a second non-silicon-containing film comprised of one of an organic material and a carbon-containing material that contain no silicon;

forming a second silicon oxide film on the second non-silicon-containing film;

forming a second resist pattern on the second silicon oxide film;

etching the second silicon oxide film using the second resist pattern as a mask;

etching the second non-silicon-containing film using the etched second silicon oxide film as a mask;

etching the interlayer insulating film using the etched second non-silicon-containing film as a mask to form a first hole so as to expose a top surface of the pedestal; and etching away the pedestal to form a second hole continuous with the first hole, so that a hole penetrating the interlayer insulating film is formed.

A fifth aspect in accordance with the present invention provides a semiconductor device comprising:

a semiconductor substrate;

an insulating film provided over the semiconductor substrate;

a first conductor provided under the insulating film;

a second conductor provided on the insulating film; and a conductive plug penetrating the insulating film and connecting the first conductor to the second conductor, wherein the conductive plug comprises a first plug and a second plug located under and in contact with the first plug; and a contact area between the second plug and the first conductor is larger than that between the first plug and the second plug.

The present invention can provide a method for manufacturing a semiconductor device which method includes a hole forming step that can reduce tapering of a hole toward the bottom even if the hole is deep and has a high aspect ratio. This provides an appropriate opening area at the hole bottom, making it possible to prevent an increase in the contact resistance between the plug and the lower conductor. The present invention can also avoid occluding the bottom space of the capacitor cylinder hole, allowing the formation of a capacitor with favorable characteristics. The present invention can also provide a semiconductor device having a plug structure appropriately connected to the lower conductor.

DETAILED DESCRIPTION OF THE PREFERRED EMBODIMENTS

Figure 1:
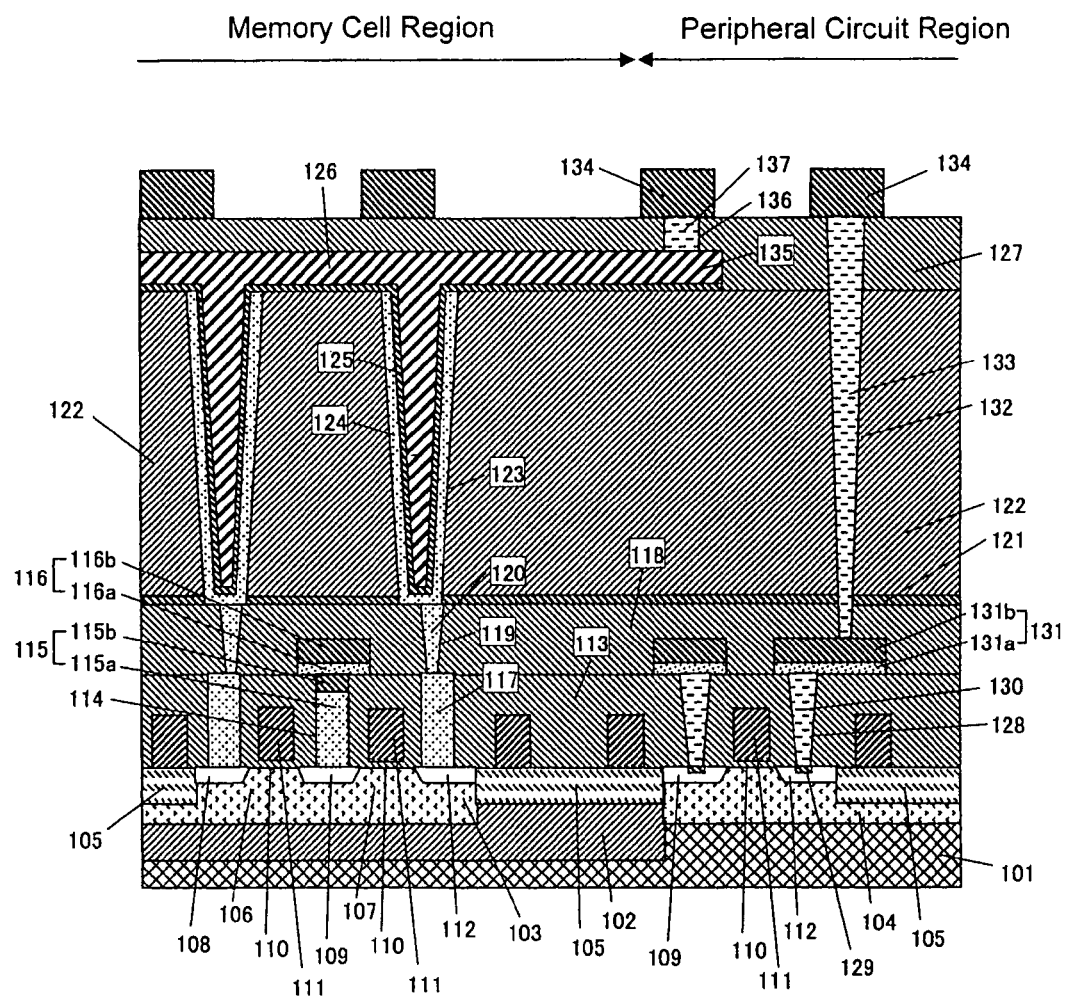
FIG. 1 is a schematic sectional view illustrating a conventional DRAM structure.

In accordance with an embodiment of the present invention, a columnar pedestal is pre-formed at a position where a hole is to be formed; the pedestal is formed of a material that can be etched away using oxygen plasma or hydrogen plasma. An interlayer insulating film is then formed over the pedestal; the interlayer insulating film is formed of silicon oxide and has a predetermined thickness. The silicon oxide on the pedestal is subsequently etched by normal dry-etching using fluorine ions to form a first hole to expose a top surface of the pedestal. The pedestal is subsequently etched away using oxygen plasma or hydrogen plasma to form a second hole continuous with the first hole. A hole is thus formed which comprises the first and second holes and penetrates the interlayer insulating film. Consequently, above the pedestal, the silicon oxide can be made thinner by a value equal to the height of the pedestal, enabling a reduction in the burden of dry-etching the silicon oxide. Since the pedestal is formed of the material that can be easily etched away using oxygen plasma or hydrogen plasma, the pedestal etching does not etch silicon oxide, silicon, and a non-carbon-containing material such as metal. This enables the formation of an opening at the bottom of the hole where the size of the opening corresponds to the size of the bottom surface of the pedestal initially formed, providing a sufficient contact area between a plug formed in the hole and the lower conductor.

In accordance with another embodiment of the present invention, a columnar pedestal is pre-formed at a position on a plug where a cylinder hole for a capacitor is to be formed; the pedestal is formed of a material that can be etched away using oxygen plasma or hydrogen plasma. An interlayer insulating film is then formed over the pedestal; the interlayer insulating film is formed of silicon oxide and has a predetermined thickness. The silicon oxide on the pedestal is subsequently etched by normal dry etching using fluorine ions to form a first hole to expose a top surface of the pedestal. The pedestal is subsequently etched away using oxygen plasma or hydrogen plasma to form a second hole continuous with the first hole. A cylinder hole for a capacitor is thus formed which comprises the first and second holes and penetrates the interlayer insulating film. Consequently, above the pedestal, the silicon oxide to be etched can be made thinner by a value equal to the height of the pedestal, enabling a reduction in the burden of dry-etching the silicon oxide. Further, a space formed by the pedestal can be left at the bottom of the cylinder hole after the removal of the pedestal, providing a sufficient space at the bottom of the cylinder hole. This enables the formation of an appropriate capacitor structure comprising a lower electrode, a dielectric, and an upper electrode.

A preferred embodiment of the present invention will be described below in detail with reference to FIGS. 2A to 2H and 3A to 3S.

Embodiment 1

First, a basic manufacturing method in accordance with the present invention will be described with reference to FIGS. 2A to 2H. A pedestal used to form a hole can be formed using a carbon-containing material such as amorphous carbon or an organic material such as an organic coating film material. It is preferably formed using a non-silicon-containing material. In the present embodiment, description will be given of an example in which amorphous carbon is used.

Figure 2:
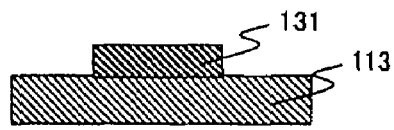
FIGS. 2A to 2H are a series of sectional views illustrating an embodiment of the present invention.
Figure 2:
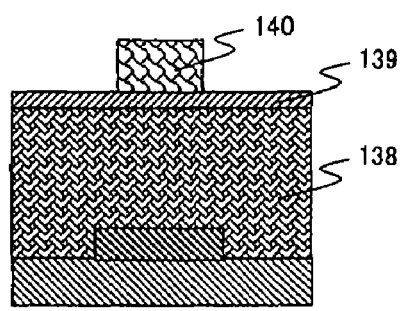
Figure 2:
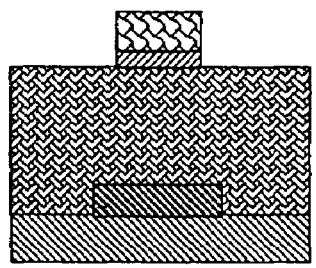
Figure 2:
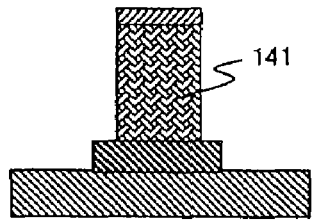
Figure 2:
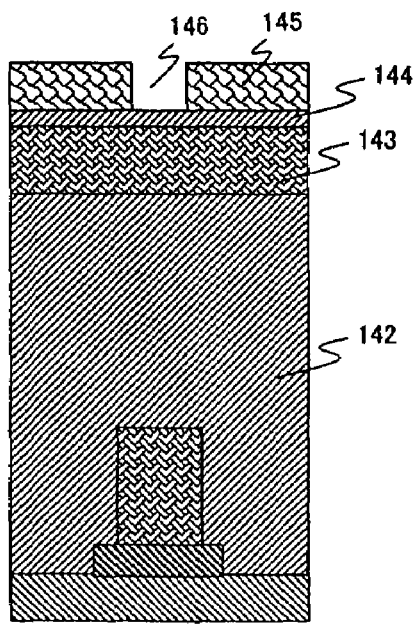
Figure 2:
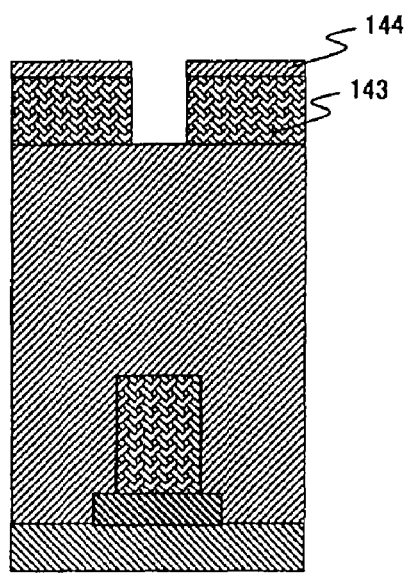
Figure 2:
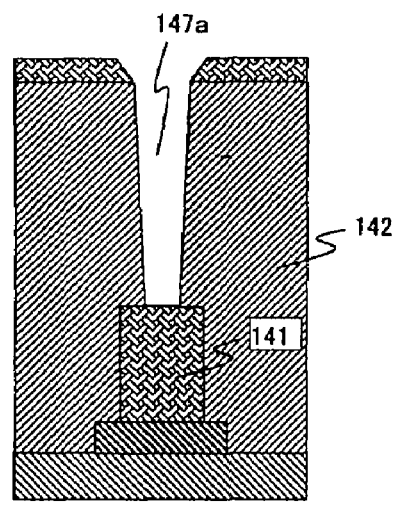
Figure 2:
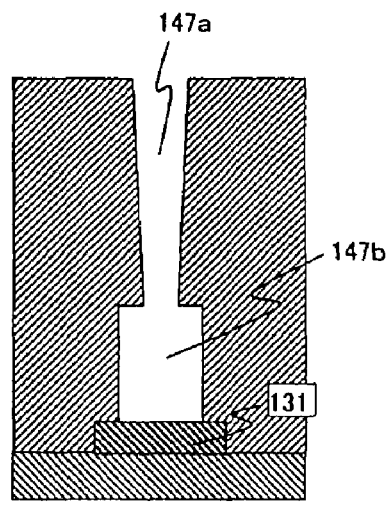

First, as shown in FIG. 2A, an interconnection 131 consisting of tungsten is formed on an interlayer insulating film 113 consisting of silicon oxide. The interconnection 131 is formed by forming a film all over the surface of the interlayer insulating film 113 by sputtering and then subjecting the film to normal lithography and dry etching.

Then, on the resulting structure, an amorphous carbon film 138 and a silicon oxide film 139 are formed and stacked in this order as shown in FIG. 2B; a pattern of a photo resist 140 is formed on the silicon oxide film 139.

The amorphous carbon film 138 is formed by plasma CVD (Chemical Vapor Deposition) at 550° C. using butane (C4H10) as source gas. Carbon hydride gas other than butane can be used as source gas. The silicon oxide film 139 is formed by plasma CVD using tetraethoxysilane (TEOS) as a source. The photo resist 140 is formed by normal lithography.

Then, as shown in FIG. 2C, the silicon oxide film 139 is dry-etched by fluorine-containing gas plasma using the pattern of the photo resist 140 as a mask.

Octaflorocyclobutane (C4F8) is used as source gas for fluorine. However, octaflorocyclopentane (C5F8) or any other carbon fluorine gas may be used.

Then, as shown in FIG. 2D, the amorphous carbon film 138 is etched by anisotropic dry etching with oxygen plasma using the silicon oxide film 139 as a mask. A pedestal 141 is thus formed. At this time, the photo resist 140, mainly consisting of carbon, is simultaneously etched, but not the silicon oxide film 139, interconnection 131, or interlayer insulating film 113, which contains no carbon.

Then, on the resulting structure, an interlayer insulating film 142, an amorphous carbon film 143, and a silicon oxide film 144 are formed and stacked in this order as shown in FIG. 2E. A photo resist 145 with an opening 146 for hole formation is further formed on the silicon oxide film 144. In this case, after the formation of the interlayer insulating film 142, its surface is flattened by CMP (Chemical Mechanical Polishing).

Then, as shown in FIG. 2F, the silicon oxide film 144 is etched using the photo resist 145 as a mask. The amorphous carbon film 143 is subsequently etched using the etched silicon oxide film as a mask. The opening 146 in the photo resist 145 is thus transferred to the silicon oxide film 144 and amorphous carbon film 143 to form an opening in these films.

The silicon oxide film is etched by fluorine-containing plasma, and the amorphous carbon film is etched by oxygen gas plasma. The photo resist 145 disappears when the amorphous carbon film is etched by oxygen gas plasma.

Then, as shown in FIG. 2G, the interlayer insulating film 142 is etched by fluorine-containing gas plasma using the amorphous carbon film 143 as a mask, to form a first hole 147a.

At this time, the silicon oxide film 144, used as a mask to process the amorphous carbon film 143, is simultaneously etched away. A surface of the pedestal 141 of the amorphous carbon film is exposed from the bottom of the first hole 147a.

Then, as shown in FIG. 2H, the pedestal 141 of the amorphous carbon film is selectively etched away by oxygen-containing plasma, to form a second hole 147b. At this stage, a through-hole comprising the first hole 147a and the second hole 147b is formed to expose a surface of the interconnection 131 from the bottom of the through-hole.

The through-hole is subsequently filled with a conductor material to form a via plug used to connect the interconnection 131 to an upper interconnection that is formed later.

As a result, a first conductive plug to be formed in the first hole 147a is shaped like a mortar having a downward tapered cross section. A second conductive plug to be formed in the second hole 147b is shaped like a cylinder having a rectangular cross section.

In this step, the amorphous carbon film 143, used as a processing mask to form a first hole, is simultaneously etched and disappears. However, the interlayer insulating film 142 and the interconnection 131 are not etched.

In the present embodiment, the pedestal is formed of the amorphous carbon film that can be easily dry-etched using oxygen plasma; the pedestal is formed under the area in which a through-hole is to be formed; and the interlayer insulating film is formed over the pedestal. This enables a substantial reduction in the etching depth of the interlayer insulating film, making it possible to avoid possible errors such as stopping of etching at the bottom of the hole. Further, the opening area of the hole bottom for contact with the lower interconnection layer is determined by the diameter of the pedestal formed of the amorphous carbon film. This prevents the possible adverse effects of the etching characteristics of the interlayer insulating film. As a result, an appropriate contact area can be provided between the plug in the hole and the lower interconnection layer.

Furthermore, in the present embodiment, the etching mask used in each processing stage is composed of the same material as that of the target to be etched in the subsequent step. The etching mask thus automatically disappears in each etching stage, eliminating the need to provide each stage with a separate step of removing the mask. This enables the steps to be simplified.

In the present embodiment, the amorphous carbon film formed by CVD is used to form a pedestal. However, an organic coating film that can be formed by spin coating may be used to from a pedestal. The organic coating film is advantageous in that its surface can be made flatter than the surface of a carbon film formed by CVD. The organic coating film preferably has heat resistance of about 400° C. Further, in the present embodiment, oxygen-containing plasma is used to etch the amorphous carbon film. However, hydrogen plasma or ammonia plasma may be used.

Embodiment 2

Figure 3A:
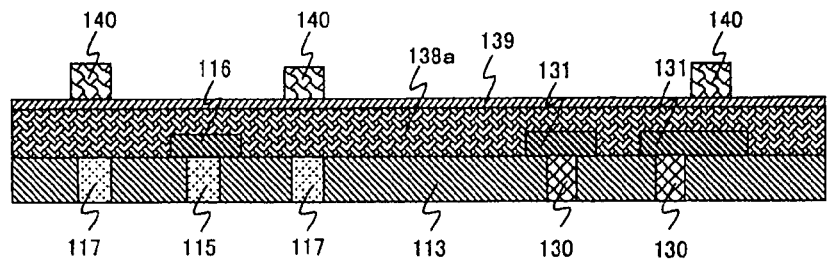
FIGS. 3A to 3S are a series of sectional views illustrating another embodiment of the present invention.

Now, a second embodiment of the present invention will be described with reference to FIGS. 3A to 3S citing an example in which the manufacturing method in accordance with the present invention is applied to the formation of a part (cylinder hole 123, capacitance contact hole 119, and through-hole 132) of the DRAM shown in FIG. 1 and in which an organic coating film is used to form a pedestal. Like FIG. 1, FIGS. 3A to 3S show a memory cell region in their left half and a peripheral circuit region in their right half. The same parts as those in FIG. 1 are denoted by the same reference numerals.

First, as shown in FIG. 3A, contact plugs 117, bit interconnection contact plugs 115, and contact plugs 130 are formed in predetermined regions of the interlayer insulating film 113. Bit interconnections 116 of thickness 70 nm and interconnection layers 131 of thickness 70 nm are subsequently formed on the interlayer insulating film; the bit interconnections 116 are connected to the bit interconnection contact plugs 115, and the interconnection layers 131 are connected to the contact plugs 130. Subsequently, on the resulting structure, an organic coating film 138a of thickness 200 nm is formed. A silicon oxide film 139 of thickness 20 nm is further formed on the organic coating film 138a by plasma CVD at 350° C. using monosilane (SiH4) and oxygen as source gas. Photo resist patterns 140 are then formed on the silicon oxide film 139 at predetermined positions.

The organic coating film may be a coating organic material such as an organic polymer material. In particular, it is possible to select, as a coating organic material, SiLK (trade name), an insulating organic polymer material commercially available from The Dow Chemical Company and containing no silicon. Since the material can form a coating film, its surface is very flat. The organic coating film can be formed by normal spin coating.

Figure 3B:
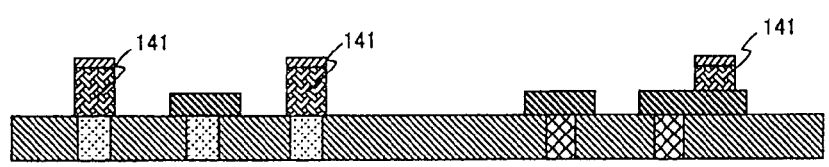

Then, as shown in FIG. 3B, the silicon oxide film 139 is etched by fluorine-containing plasma using the photo resist patterns 140 as a mask. The organic coating film 138a is subsequently etched by oxygen-containing plasma using the photo resist patterns 140 and silicon oxide film 139 as a mask. Pedestals 141 are thus formed. At this time, the photo resist patterns 140 are simultaneously etched away.

Figure 3C:
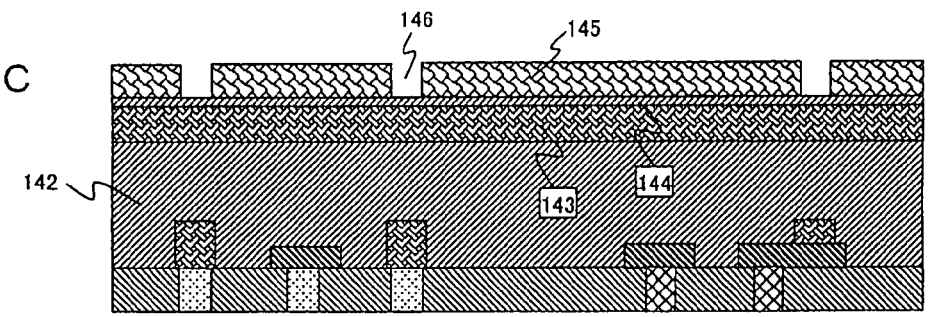

Then, as shown in FIG. 3C, a silicon oxide film 142 of thickness 400 nm is formed by plasma CVD using tetraethoxysilane (TEOS) as a source. A surface of the silicon oxide film 142 is flattened by CMP. An amorphous carbon film 143 of thickness 150 nm and a silicon oxide film 144 of thickness 20 nm are subsequently formed on the flattened silicon oxide film 142 in this order. On the resulting structure, photo resist 145 with openings 146 for hole formation is further formed.

Figure 3D:
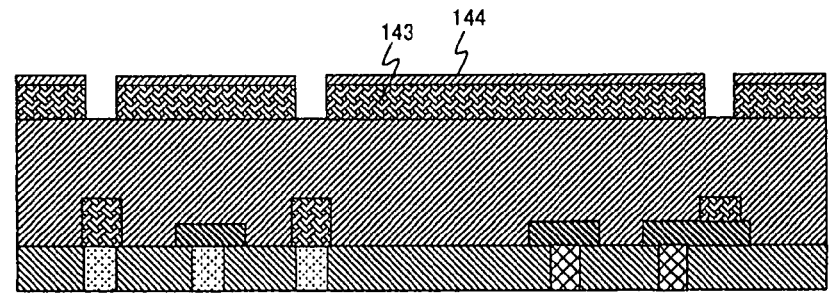

Then, as shown in FIG. 3D, the silicon oxide film 144 is etched using the photo resist 145 as a mask; the amorphous carbon film 143 is subsequently etched using the etched silicon oxide film as a mask. The openings 146 in the photo resist 145 are thus transferred to the silicon oxide film 144 and amorphous carbon film 143 to form openings in these films. The silicon oxide film is etched by fluorine-containing plasma, and the amorphous carbon film is etched by oxygen gas plasma. The photo resist 145 is etched away simultaneously with the etching of the amorphous carbon film.

Figure 3E:
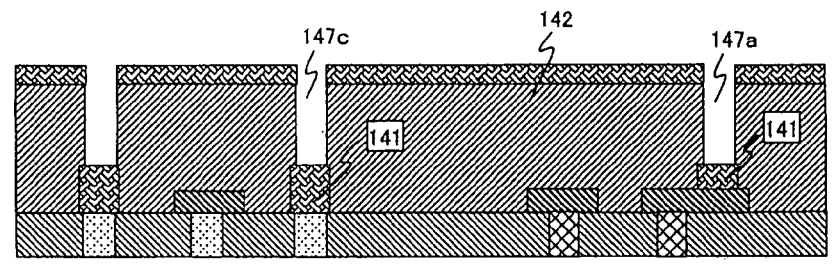
Figure 3:
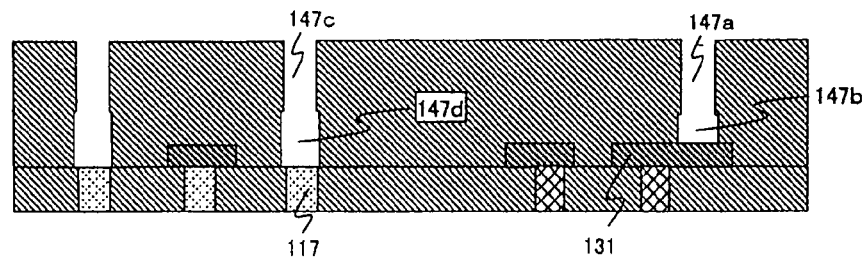
Figure 3:
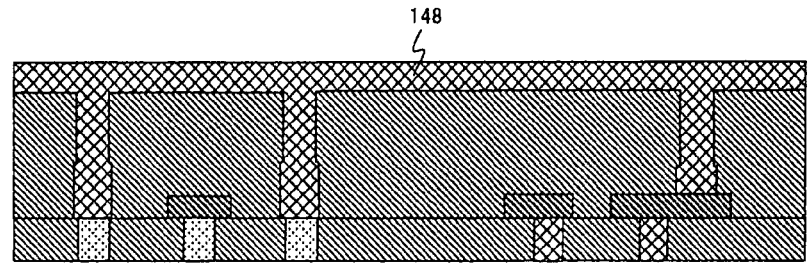
Figure 3:
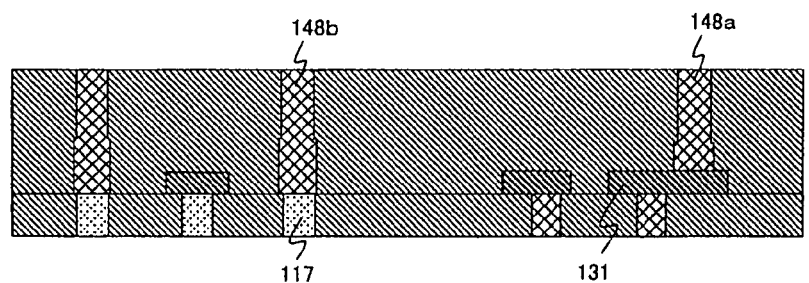
Figure 3:
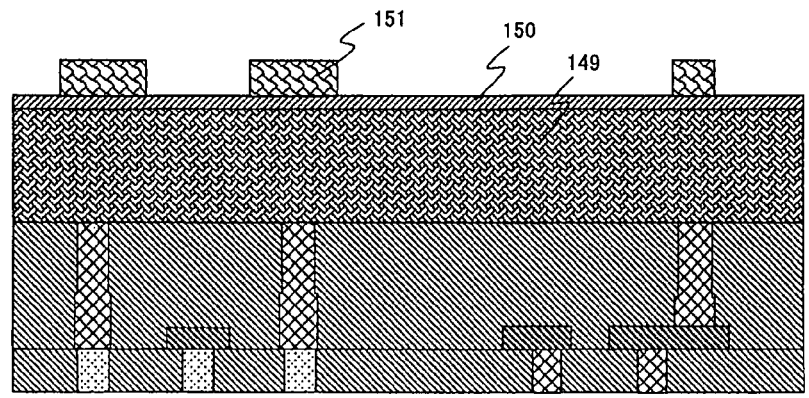
Figure 3:
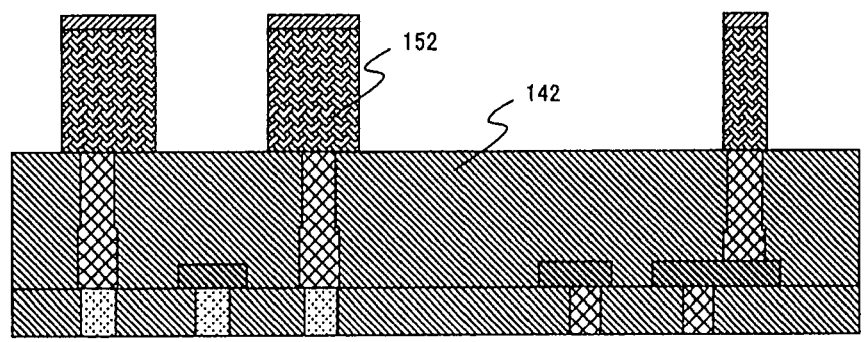
Figure 3:
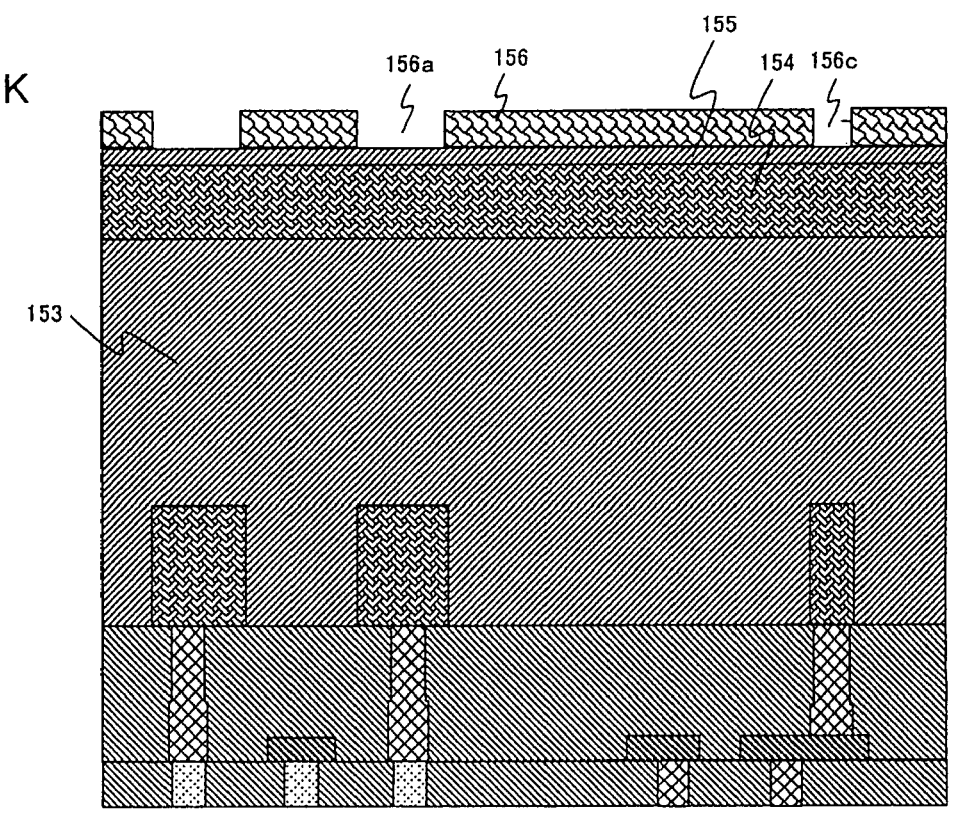
Figure 3:
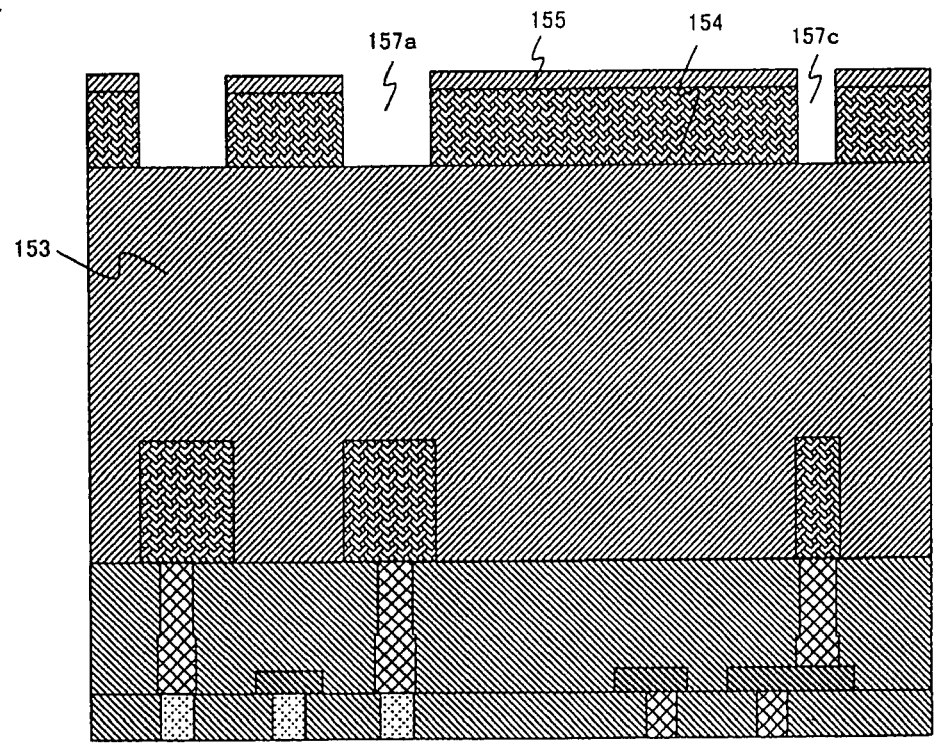
Figure 3:
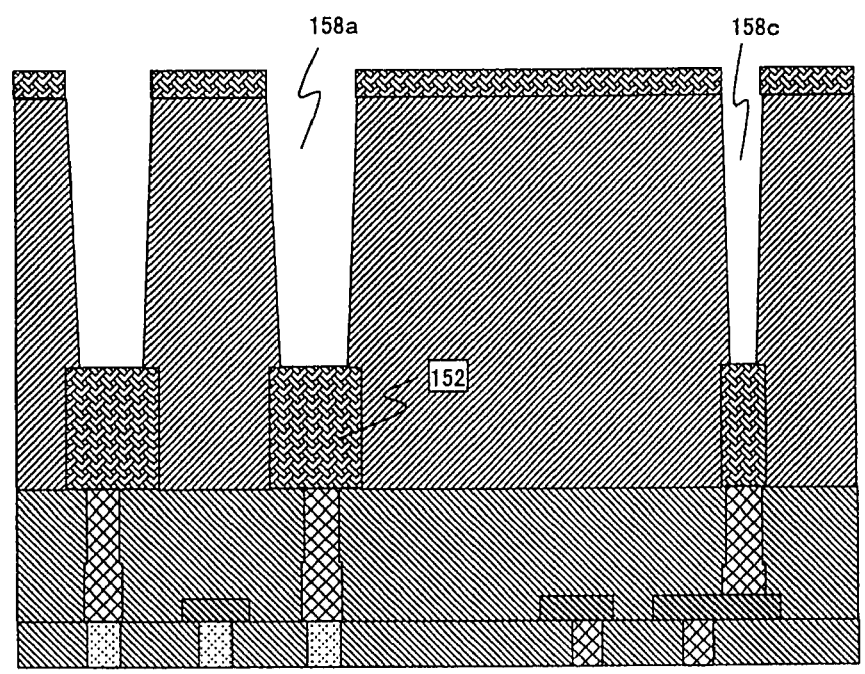
Figure 3:
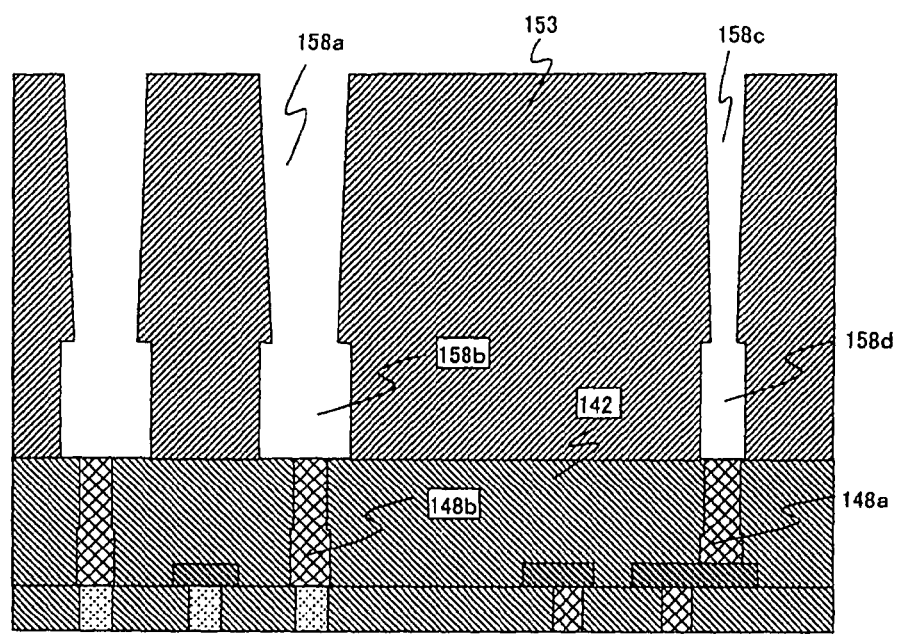
Figure 3:
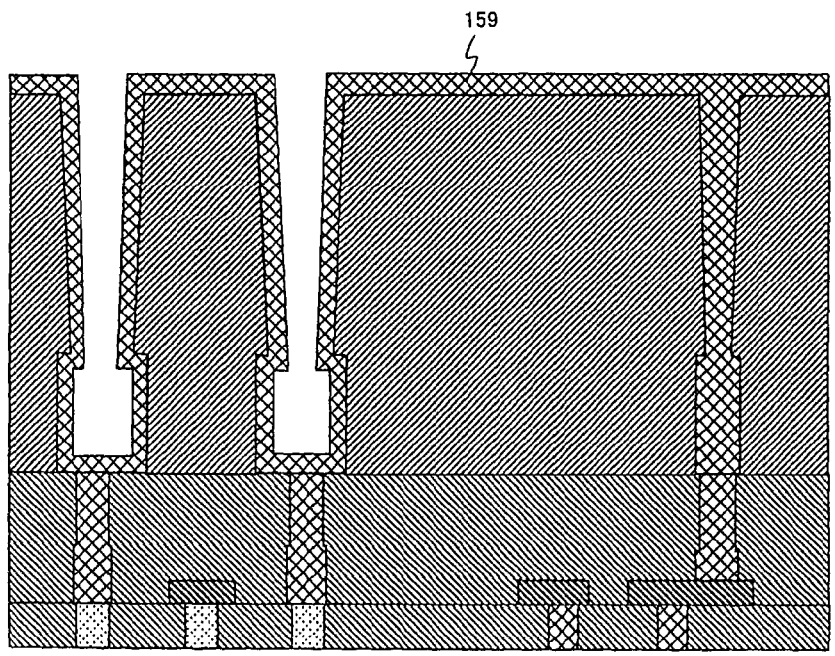
Figure 3:
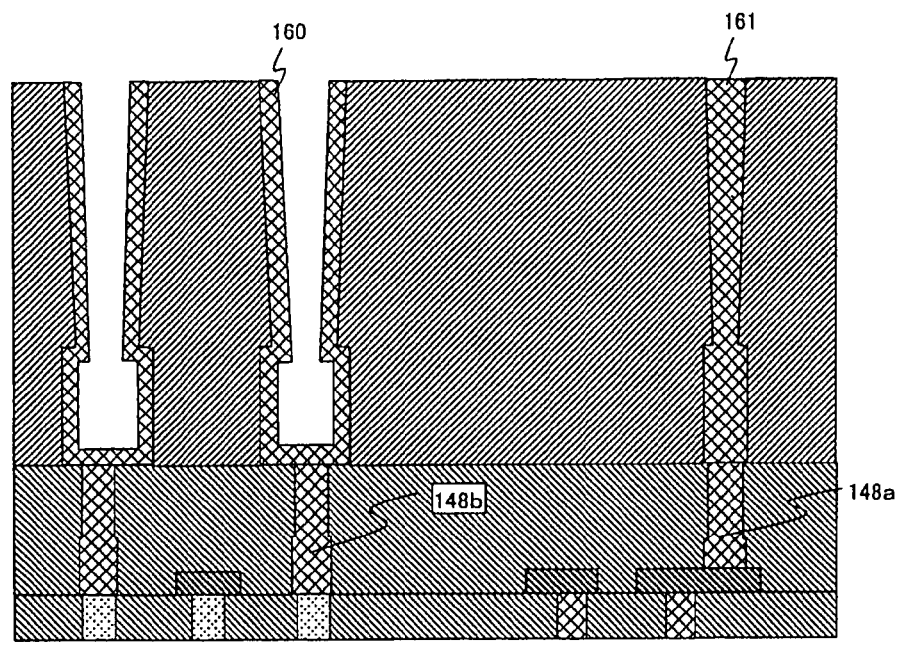
Figure 3:
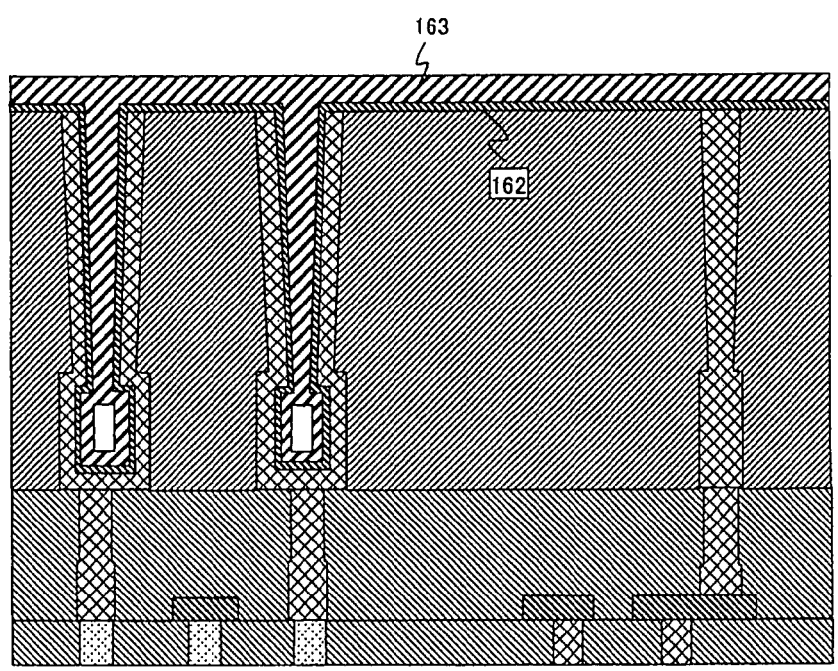
Figure 3:
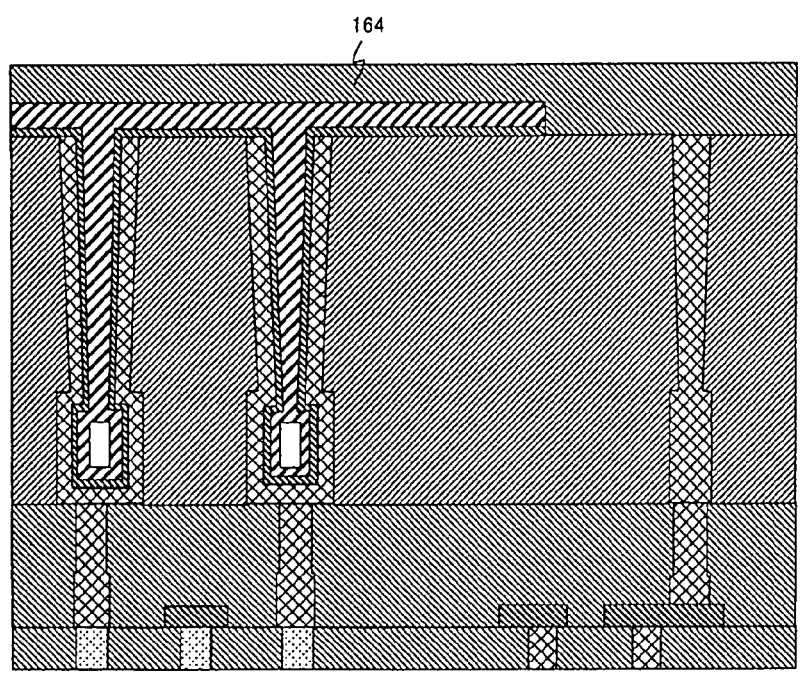
Figure 3:
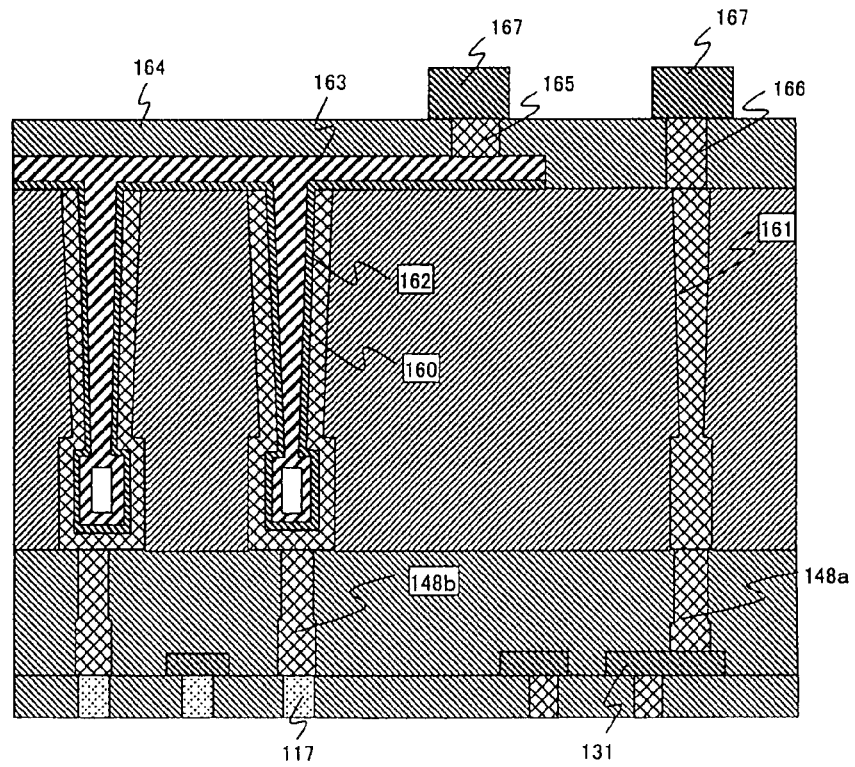

Then, as shown in FIG. 3E, the silicon oxide film 142 is etched by fluorine-containing plasma through the silicon oxide film 144 and amorphous carbon film 143 as a mask, to form first holes 147a and 147c. This etching exposes a surface of each pedestal 141 from the bottom of the corresponding hole. Further, the silicon oxide film 144 is simultaneously etched away.

Then, as shown in FIG. 3F, the pedestals 141 formed of the organic coating film, which are exposed from the bottoms of the first holes 147a and 147c, are removed by oxygen-containing plasma to form second holes 147b and 147d. Thus, a through-hole composed of the first hole 147c and the second hole 147d, in the memory cell region, with the contact plug 117 exposed from the bottom of the through-hole. A through hole comprising the first hole 147a and the second hole 147b is formed in the peripheral circuit region, with the interconnection layer 131 exposed from the bottom of the through-hole. This treatment simultaneously etches away the amorphous carbon film 143 at the surface of the resulting structure.

Then, as shown in FIG. 3G, tungsten 148 is formed by well-known CVD using tungsten fluoride as a source, so as to fill the through-hole. If the contact plug 117 in the memory cell region is formed of silicon, an excessive silicide reaction may unpreferably occur between the tungsten and silicon. To prevent this, a thin silicide layer and a titanium nitride barrier layer may be formed by well-known CVD before the formation of tungsten. If the contact plug is formed of metal or the like, the barrier layer need not be formed. However, the barrier layer may be formed without posing any problem.

Then, as shown in FIG. 3H, the tungsten 148 is removed from the surface of the resulting structure by CMP. As a result, a capacitor contact plug 148b connected to the contact plug 117 is formed in the memory cell region. A via plug 148a connected to the interconnection layer 131 is formed in the peripheral circuit region.

Then, on the resulting structure, an organic coating film 149 of thickness 1000 nm is formed, and an silicon oxide film 150 of thickness 50 nm is then formed on the organic coating film 149 by CVD, as shown in FIG. 3I. Photo resist patterns 151 are then formed on the silicon oxide film 150 by lithography.

Then, as shown in FIG. 3J, the silicon oxide film 150 is etched by fluorine-containing plasma using the photo resist patterns 151 as a mask. The organic coating film 149 is further etched by oxygen-containing plasma using the etched silicon oxide film as a mask, to form pedestals 152 composed of the organic coating film. The etching by oxygen-containing plasma simultaneously etches away the photo resists 151.

Then, as shown in FIG. 3K, a silicon oxide film 153, an amorphous carbon film 154 of thickness 600 nm, and a silicon oxide film 155 of thickness 50 nm are formed in this order by CVD. Further, photo resist 156 having openings 156a and 156c for hole formation in predetermined regions is formed. The opening 156a, which is formed in the memory cell region, has a short diameter of 240 nm. The opening 156c, which is formed in the peripheral circuit region, has a diameter of 130 nm.

After forming the silicon oxide film 153, its surface is flattened by CMP so that it has a thickness 3,000 nm from the surface of the silicon oxide film 142. Since the pedestal 152, which is formed of the organic coating film, has a height of 1,000 nm, the silicon oxide film on the pedestal 152 has a thickness of 2,000 nm.

Then, as shown in FIG. 3L, the silicon oxide film 155 is etched by fluorine-containing plasma using the photo resist 156 as a mask; the amorphous carbon film 154 is then etched by oxygen-containing plasma. The openings 156a and 156c in the photo resist 156 are thus transferred to the silicon oxide film 155 and amorphous carbon film 154 to form openings 157a and 157c in these films. The photo resist 156 is etched away simultaneously with the etching of the amorphous carbon film by oxygen-containing plasma.

Then, as shown in FIG. 3M, the silicon oxide film 153 is etched by fluorine-containing plasma using the amorphous carbon film 154 as a mask; a first cylinder hole 158a and a first through-hole 158c are thus formed in the memory cell region and in the peripheral circuit region, respectively, to expose surfaces of the pedestals 152 formed of the organic coating film from the respective hole bottoms. At this time, the silicon oxide film 155 is simultaneously removed.

Then, as shown in FIG. 3N, the pedestals 152, comprising the organic coating film, are etched by oxygen-containing plasma, to form a second cylinder hole 158b and a second through-hole 158d. At this stage, a capacitor cylinder hole comprising the first cylinder hole 158a and the second cylinder hole 158b is formed in the memory cell region to expose a surface of the capacitor contact plug 148b from the bottom. On the other hand, a through hole comprising the first through-hole 158c and the second through-hole 158d is formed in the peripheral circuit region to expose a surface of the via plug 148a from the hole bottom.

In etching the thick silicon oxide film 153 to form a hole, the conventional technique requires an etching stopper film such as a silicon nitride film to be interposed between the thick silicon oxide film 153 and a silicon oxide film 142 located under the thick silicon oxide film 153 so as not to etch the silicon oxide film 142. In contrast, the organic coating film used in the present embodiment can be selectively etched away by oxygen-containing plasma; the other films including the silicon oxide films, silicon films, and metal films are accordingly not etched when the organic coating film is etched away. Therefore, no other film needs to be interposed between the silicon oxide film 153 and the silicon oxide film 142 as an etching stopper film.

When the organic coating film is removed by oxygen-containing plasma, a tungsten oxide film of thickness about 1 nm may be formed on the surface of the capacitor contact plug 148b and via plug 148a to increase contact resistance. To avoid this, the tungsten oxide can be reduced to tungsten by thermal treatment in a hydrogen atmosphere at about 400° C. after the etching of the organic coating film by oxygen-containing plasma. Alternatively, the organic coating film may be etched by hydrogen or ammonia plasma instead of oxygen-containing plasma.

Then, all over the surface of the resulting structure, a tungsten film 159 of thickness 70 nm is formed by CVD as shown in FIG. 3O. The opening of the through-hole, which is formed in the peripheral circuit region, is 130 nm in diameter. Consequently, the formation of tungsten of thickness 70 nm fills the through-hole with tungsten. On the other hand, the opening of the cylinder hole, formed in the memory cell region, has a short diameter of 240 nm. Consequently, the cylinder hole is not filled and a tungsten film is formed on the inner wall of the cylinder hole.

Then, as shown in FIG. 3P, the exposed tungsten film 159 out of the cylinder hole and through-hole is removed by CMP. Dry etching may be used instead of CMP. If dry etching is used, the internal space of the cylinder hole is desirably filled with photo resist or the like.

By removing the tungsten film 159 out of the holes outer surface forms, in the memory cell region, a lower electrode 160 of a capacitor is formed in the cylinder hole, where the lower electrode is connected to the capacitor contact plug 148b. On the other hand, a via plug 161 connected to the via plug 148a is formed in the peripheral circuit region.

Then, as shown in FIG. 3Q, a dielectric layer 162 and an upper electrode layer 163 both constituting the capacitor are formed. The dielectric layer 162 can be formed of aluminum oxide, hafnium oxide, tantalum oxide, or the like by ALD (Atomic Layer Deposition). The upper electrode layer 163 can be formed of titanium nitride or the like by CVD or ALD. Tungsten or the like may be stacked, by sputtering, on the titanium nitride film constituting the upper electrode layer.

Then, as shown in FIG. 3R, the dielectric layer 162 and upper electrode layer 163 in the peripheral circuit region are removed by lithography and dry etching. A silicon oxide film 164 of thickness 500 nm is subsequently formed. A surface of the silicon oxide film 164 is then flattened by CMP. The upper electrode layer 163 is dry-etched by chlorine-containing plasma.

Then, as shown in FIG. 3S, via plugs 165 and 166 are formed in predetermined regions of the silicon oxide film 164, and metal interconnection layers 167 are formed.

The above steps provide, in the memory cell region, the capacitor contact plug 148b connected to the contact plug 117, and the capacitor connected to the capacitor contact plug 148b. The upper electrode 163 of the capacitor is connected to the interconnection layer 167 via the via plug 165. The via plugs 148a, 161, and 166 are formed in the peripheral circuit region; the via plug 148a is connected to the interconnection layer 131, the via plug 161 is connected to the via plug 148a, and the via plug 166 is connected to the via plug 161. The interconnection layer 131 is connected to the interconnection layer 167 via the plurality of via plugs.

In the present embodiment, the pedestals composed of the organic coating film are pre-formed at the positions where holes are to be formed, and the interlayer insulating film composed of the silicon oxide film is formed over the pedestals. This substantially reduces the etching depth of the silicon oxide film, enabling a substantial reduction in the difficulty with which the silicon oxide film is processed to form a hole. The pedestals, which are composed of the organic coating film and are exposed from the hole bottom by etching the overlying silicon oxide film, can be easily etched away by plasma in an oxygen, hydrogen, or ammonia atmosphere, preventing the possible stopping of etching at the hole bottom and the possible occlusion of the hole as occur with the conventional technique. Moreover, the organic coating film can be selectively etched in an atmosphere containing no halogen gas such as fluorine. This accordingly prevents the other films including the silicon oxide films, silicon films, and metal films from being etched, so that the other constituents are not being affected during etching of the organic coating film.

Therefore, the diameter of the hole bottom can be controlled by the diameter of the pedestal composed of the organic coating film; this enables an appropriate contact area to be provided between the plugs and between the plug and the interconnection to avoid a disadvantageous increase in contact resistance. In the illustrated embodiment, the cylinder hole forming the capacitor in the memory cell region is formed simultaneously with the formation of the via plug in the peripheral circuit region. However, obviously, the present invention is applicable to the case where only one of the cylinder hole and the plug is formed.

What is claimed is:

1. A method for manufacturing a semiconductor device, comprising forming a hole penetrating an insulating film over a semiconductor substrate, wherein the method comprises the steps of:
    forming a pedestal at a position where a hole to be formed, said pedestal being formed by patterning a non-silicon-containing film using silicon oxide as a mask, said pedestal comprising a non-silicon-containing pattern composed of an organic material or a carbon-containing material;
    forming an insulating film to bury the pedestal;
    forming a first hole in the insulating film so as to expose a top surface of the pedestal, the first hole having a first cross section at which the top surface of the pedestal is exposed; and
    completely removing the pedestal to form a second hole continuous with the first hole to form a hole penetrating the insulating film, the second hole having a second cross section at which the second hole is continuous with the first hole, the first cross-section being smaller than the second hole.

2. The method for manufacturing a semiconductor device according to claim 1, wherein the pedestal is formed of one an organic coating film and an amorphous carbon film.

3. The method for manufacturing a semiconductor device according to claim 1, wherein the insulating film is formed of silicon oxide.

4. The method for manufacturing a semiconductor device according to claim 1, further comprising the step of flattening a surface of the insulating film after the step of forming an insulating film to bury the pedestal and before the step of forming a first hole in the insulating film.

5. A method for manufacturing a semiconductor device, comprising forming a conductive plug penetrating an insulating film over a semiconductor substrate and connecting to a conductor under the insulating film, wherein the method comprises the steps of:
    forming a pedestal on a conductor, said pedestal being formed by patterning a non-silicon-containing film using silicon oxide as a mask, said pedestal comprising a non-silicon-containing pattern composed an organic material or a carbon-containing material;
    forming an insulating film to bury the pedestal;
    forming a first hole in the insulating film so as to expose a top surface of the pedestal, the first hole having a first cross section at which the top surface of the pedestal is exposed;
    completely removing the pedestal to form a second hole continuous with the first hole so as to expose a surface of the conductor, the second hole having a second cross section at which the second hole is continuous with the first hole, the first cross section being smaller than the second hole; and
    filling the first hole and the second hole with a conductive material to form a conductive plug penetrating the insulating film and connecting to the conductor.

6. A method for manufacturing a semiconductor device, comprising the steps of:
    forming a conductive plug in a first interlayer insulating film formed over a semiconductor substrate;
    forming a pedestal on the conductive plug, said pedestal being formed by patterning a non-silicon-containing film using silicon oxide as a mask, said pedestal comprising a non-silicon-containing pattern composed an organic material or a carbon-containing material;
    forming a second interlayer insulating film to bury the pedestal;
    forming a first hole in the second interlayer insulating film so as to expose a top surface of the pedestal, the first hole having a first cross section at which the top surface of the pedestal is exposed;
    completely removing the pedestal to form a second hole continuous with the first hole so as to expose a surface of the conductive plug, the second hole having a second cross section at which the second hole is continuous with the first hole, the first cross section being smaller than the second hole;
    forming a first conductive layer on an inner surface of the first hole and the second hole to form a lower electrode comprising the first conductive layer and connecting to the conductive plug;
    forming a dielectric layer on the first conductive layer in the first hole and the second hole; and
    forming a second conductive layer on the dielectric layer in the first hole and the second hole to form a capacitor comprising an upper electrode, the dielectric layer, and the lower electrode, the upper electrode comprising the second conductive layer.

7. A method for manufacturing a semiconductor device, comprising forming a hole penetrating an interlayer insulating film over a semiconductor substrate, wherein the method comprises the steps of:

forming a first non-silicon-containing film composed of one of an organic material and a carbon-containing material that contain no silicon over the semiconductor substrate;

forming a first silicon oxide film on the first non-silicon-containing film;

forming a first resist pattern on the first silicon oxide film;

etching the first silicon oxide film using the first resist pattern as a mask;

etching the first non-silicon-containing film using the etched first silicon oxide film as a mask to form a pedestal at a position where a hole is to be formed;

forming an interlayer insulating film composed of silicon oxide so as to bury the pedestal;

forming, on the interlayer insulating film, a second non-silicon-containing film comprised of one of an organic material and a carbon-containing material that contain no silicon;

forming a second silicon oxide film on the second non-silicon-containing film;

forming a second resist pattern on the second silicon oxide film;

etching the second silicon oxide film using the second resist pattern as a mask;

etching the second non-silicon-containing film using the etched second silicon oxide film as a mask;

etching the interlayer insulating film using the etched second non-silicon-containing film as a mask to form a first hole so as to expose a top surface of the pedestal; and etching away the pedestal to form a second hole continuous with the first hole, so that a hole penetrating the interlayer insulating film is formed.

* * * * *